(12) United States Patent
Liang et al.

(10) Patent No.: US 10,049,975 B2
(45) Date of Patent: Aug. 14, 2018

(54) SUBSTRATE STRUCTURE

(71) Applicant: Siliconware Precision Industries Co., Ltd., Taichung (TW)

(72) Inventors: Fang-Yu Liang, Taichung (TW); Hung-Hsien Chang, Taichung (TW); Yi-Che Lai, Taichung (TW); Wen-Tsung Tseng, Taichung (TW); Chen-Yu Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/258,303

(22) Filed: Sep. 7, 2016

(65) Prior Publication Data

US 2017/0229386 A1 Aug. 10, 2017

(30) Foreign Application Priority Data

Feb. 5, 2016 (TW) .............................. 105104042 A

(51) Int. Cl.
| | |
|---|---|
| *H05K 7/10* | (2006.01) |
| *H05K 7/12* | (2006.01) |
| *H01L 23/498* | (2006.01) |
| *H01L 23/00* | (2006.01) |

(52) U.S. Cl.
CPC .. *H01L 23/49827* (2013.01); *H01L 23/49816* (2013.01); *H01L 23/49838* (2013.01); *H01L 23/562* (2013.01); *H01L 2224/73204* (2013.01); *H01L 2924/181* (2013.01)

(58) Field of Classification Search
USPC .......................................... 361/767; 174/264
See application file for complete search history.

(56) References Cited

U.S. PATENT DOCUMENTS

| | | | |
|---|---|---|---|
| 2014/0182912 A1* | 7/2014 | Lin | ................... H01L 23/49811 174/261 |
| 2015/0021751 A1* | 1/2015 | Paek | ................. H01L 23/49582 257/676 |

* cited by examiner

*Primary Examiner* — Andargie M Aychillhum
(74) *Attorney, Agent, or Firm* — Mintz Levin Cohn Ferris Glovsky and Popeo, P.C.; Peter F. Corless; Steven M. Jensen

(57) ABSTRACT

A substrate structure is provided, including a substrate body having a conductive pad, an insulation layer formed on the substrate body and exposing the conductive pad, a conductive pillar disposed on the conductive pad, and a metal pad disposed on the insulation layer and electrically connected to the conductive pillar. A conductive component can be coupled to the metal pad. During a high-temperature process, the conductive pillar and the metal pad disperse the remaining stress generated due to heat, thereby preventing the conductive component from being cracked.

7 Claims, 5 Drawing Sheets

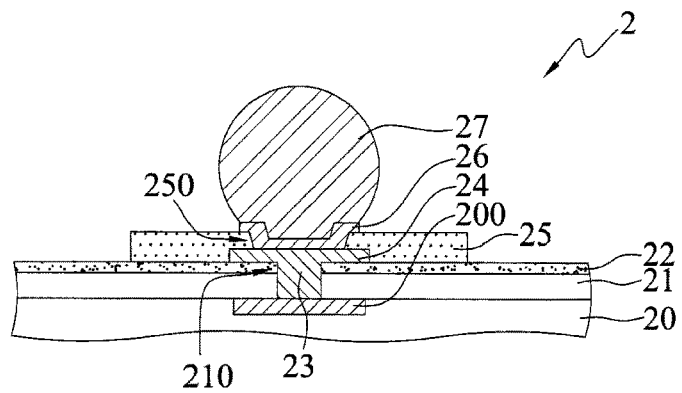
FIG. 2
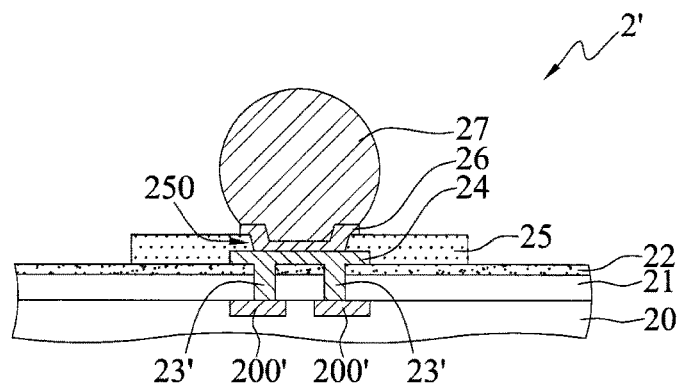
FIG. 2'
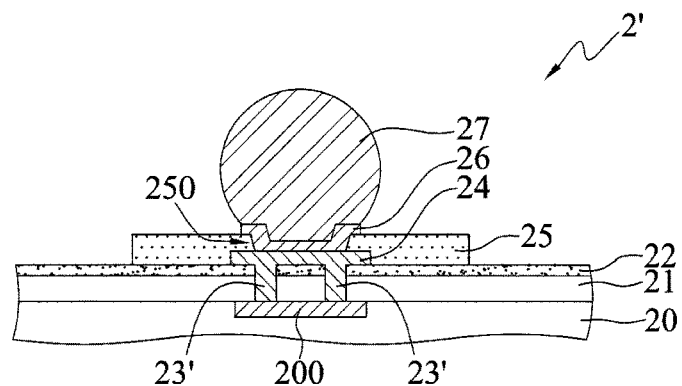
FIG. 2"

SUBSTRATE STRUCTURE

CROSS-REFERENCE TO RELATED APPLICATION

This application claims under 35 U.S.C. § 119(a) the benefit of Taiwanese Patent Application No. 105104042 filed Feb. 5, 2016, the entire contents of which are incorporated herein by reference.

BACKGROUND

1. Technical Field

The present disclosure relates to semiconductor structures, and, more particularly, to a substrate structure for improving reliability and yield of products.

2. Description of Related Art

Along with the vigorous development of the electronic industry, electronic products are gradually developing toward the trend of multi-function and high performance. A wide range of technologies are currently used in the field of wafer packaging, for example, flip-chip packaging modules such as chip scale packages (CSPs), direct chip attached (DCA) packages and multi-chip modules (MCM), etc., or chip stacking technology for integrating a chip into a 3D integrated circuit, and so on.

FIG. 1 is a schematic cross-sectional view of a semiconductor package 1 of 3D chip stacking technology according to the prior art. A through silicon interposer (TSI) 10 has a chip mounting side 10b and an opposite external connection side 10a, and a plurality of conductive through-silicon vias (TSVs) 100 communicating the chip mounting side 10b and the external connection side 10a. A redistribution layer (RDL) structure 11 is formed on the chip mounting side 10b. Electrode pads 60 of a semiconductor chip 6 with smaller spacing distance are electrically connected to the RDL structure 11 through a plurality of solder bumps 61. Thereafter, an underfill 62 is formed between the semiconductor chip 6 and the RDL structure 11 for encapsulating the sold bumps 61. The conductive TSVs 100 are electrically connected to bonding pads 70 of a package substrate 7 with larger spacing distance through a plurality of conductive components 17, such as bumps. After that, an encapsulating colloid 8 is formed on the package substrate 7 for encapsulating the semiconductor chip 6.

Specifically, as shown in FIG. 1', an insulation layer 12 is formed on the external connection side 10a of the TSI 10 and exposing an end surface of the conductive TSV 100 therefrom, an insulation protective layer 15 is formed on the insulation layer 12 and exposing the end surface of the conductive TSV 100, and then a UBM layer 16 is formed on the end surface of the conductive TSV 100 for combining with the conductive component 17.

However, the disadvantage for the conventional semiconductor package 1 is that during a high-temperature process, such as a reflow process that is performed to weld the conductive components 17 to the bonding pads 70, a remaining stress is generated due to heat and concentrated on an interface between the conductive components 17 and the conductive TSVs 100, as the thermal stress concentrated area K shown in FIG. 1, which causes the interface between the conductive components 17 and the conductive TSVs 100 to be cracked, thereby reducing the reliability and yield of the semiconductor chip 1.

In addition, the same problem may also occur on the solder bumps 61 disposed between the semiconductor chip 6 and the RDL structure 11, causing the interface between the solder bumps 61 and the RDL structure 11 to be cracked, as the thermal stress concentrated area K shown in FIG. 1.

Therefore, there is an urgent need in solving the foregoing problems.

SUMMARY

In order to solve the problems encountered in the conventional technology, the present disclosure is to provide a substrate structure, which includes a substrate body having at least a conductive pad; at least an insulation layer formed on the substrate body and having at least an open hole correspondingly exposing the conductive pads; at least a conductive pillar disposed in the open hole and electrically connected to the conductive pad; and a metal pad disposed on and electrically connected to each of the at least a conductive pillar.

In an embodiment, the substrate body has a plurality of the conductive pads, and the insulation layer has a plurality of the open holes. In an embodiment, each of the conductive pillars is disposed in each of the open holes.

In an embodiment, the plurality of the conductive pads are coupled to the metal pads through the plurality of the conductive pillars, respectively.

In an embodiment, each of the conductive pads is coupled to the plurality of the conductive pillars thereon.

In an embodiment, the substrate structure further includes a conductive circuit formed on the insulation layer and being in contact with the at least a metal pad and the at least a conductive pillar. In an embodiment, the at least a conductive circuit and the at least a metal pad form a circuit layer.

In an embodiment, the substrate structure further includes an insulation protective layer formed on the insulation layer and the at least a metal pad and having at least an opening for exposing the at least a metal pad. In another embodiment, the substrate structure further comprises a metal layer formed in the at least an opening or at least a conductive component disposed on the metal pad.

In summary, the substrate structure according to the present disclosure utilizes the conductive pillar and the metal pad that are formed between the conductive component and the conductive pad to disperse the remaining stress generated due to heat during a high-temperature process. Therefore, compared to the prior art, the substrate structure according to the present disclosure can prevent the conductive component from being cracked, thereby enhancing the reliability and yield of the substrate structure.

BRIEF DESCRIPTION OF THE DRAWINGS

FIG. 1' is a partial enlarged cross-sectional view of the conventional semiconductor package;

FIG. 2 is a cross-sectional view of a substrate structure according to a first embodiment of the present disclosure;

FIGS. 2' and 2" are schematic cross-sectional views showing different embodiments of FIG. 2;

FIG. 3' is a partial top view of FIG. 3;

FIG. 4' is a partial top view of FIG. 4; and

DETAILED DESCRIPTION

Figure 1:
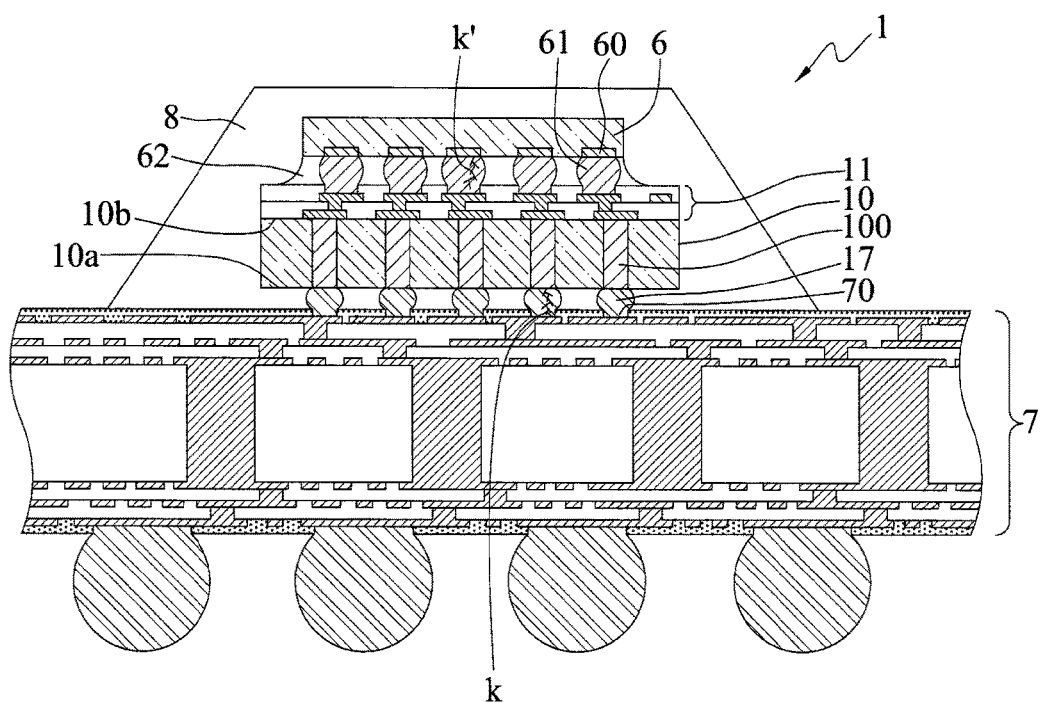
FIG. 1 is a cross-sectional view of a conventional semiconductor package.
Figure 1:
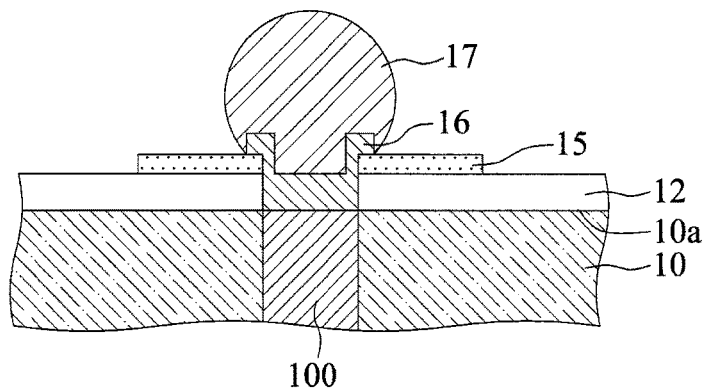

The present disclosure is described in the following with specific embodiments, so that one skilled in the pertinent art can easily understand other advantages and effects of the present disclosure from the disclosure of the present disclosure.

It is to be understood that the scope of the present disclosure is not limited to the disclosed embodiments. On the contrary, it is intended to cover various modifications and similar arrangements. The scope of the claims, therefore, should be accorded the broadest interpretation so as to encompass all such modifications and similar arrangements. In addition, words such as "on", and "a" are used to explain the preferred embodiment of the present disclosure only and should not limit the scope of the present disclosure.

FIG. 2 is a cross-sectional view of a substrate structure according to a first embodiment of the present disclosure.

As shown in FIG. 2, a substrate structure 2 comprises a substrate body 20, a plurality of insulation layers 21, 22, a conductive pillar 23, a metal pad 24, an insulation protective layer 25, a metal layer 26, and other elements.

The substrate body 20 further includes a plurality of conductive pads 200. In an embodiment, the substrate body 20 is an insulation board, a metal board, or a semiconductor board made of a material such as wafer, chip, silicon material, glass, and the like. For example, the substrate body 20 is a TSI or a glass substrate and having TSVs.

The insulation layers 21 and 22 are sequentially formed on the substrate body 20, and each of the insulation layers 21, 22 is formed with a plurality of open holes 210 corresponding in position for exposing the conductive pads 200 therethrough.

In an embodiment, the insulation layers 21, 22 can be made of the same or different materials. In an embodiment, the insulation layers 21, 22 can be made of oxide layers or nitride layers, such as silicon oxide ($SiO_2$) or silicon nitride ($Si_xN_y$).

In addition, the single conductive pad 200 is exposed through the single open hole 210 that penetrates the insulation layer 21, 22.

The conductive pillar 23 is disposed in the open hole 210 and coupled to the conductive pad 200.

In an embodiment, the conductive pillar 23 is a metal pillar, such as a copper pillar, and the single conductive pad 200 is combined with the single conductive pillar 23 thereon.

The metal pad 24 is disposed on the insulation layers 21, 22 and electrically connected to the conductive pillar 23.

In an embodiment, the metal pad 24 is in direct contact with an end surface of the conductive pillar 23.

The insulation protective layer 25 is formed on a portion of the surface of the insulation layer 22 and the metal pad 24, and has an opening 250 for exposing the metal pad 24. In an embodiment, the insulation protective layer 25 is made of Polybenzoxazole (PBO), Polyimide (PI), or Benzocyciclobutene (BCB).

The metal layer 26 is formed on the metal pad 24 disposed in the opening 250, and extends to a portion of a surface of the insulation protective layer 25 to form a conductive component 27, such as a solder ball, on the metal layer 26, for combining with an electronic device, such as a semiconductor element, a package substrate or a circuit board, etc.

In an embodiment, the metal layer 26 is an under bump metal (UBM) layer, and the metal layer 26 is made of, for example, titanium/copper/nickel or titanium/nickel vanadium/copper. A patterning process can be performed by the method of sputtering or plating in combination with exposure and development, to form the metal layer 26.

In addition, the structure and material of the metal layer 26 can be selective from a variety of choices which are not specifically limited.

Further, in an embodiment, a plurality of conductive pads 200' can be coupled to the single metal pad 24 respectively through conductive pillars 23', as the substrate structure 2' shown in FIG. 2'. Alternatively, the single conductive pad 200 is combined with the plurality of conductive pillars 23', as the substrate structure 2" shown in FIG. 2".

The substrate structures 2, 2', 2" according to the present disclosure are to form the conductive pillars 23, 23' and the metal pads 24 between the conductive component 27 and the conductive pads 200, 200' to disperse the remaining stress generated due to heat during a high-temperature process (such as during the time that the conductive component 27 is welded to a semiconductor chip or a package substrate after being reflowed). Therefore, compared to the prior art, the substrate structure 2, 2', 2" according to the present disclosure can avoid the conductive component 27 from being cracked, so as to improve the reliability and yield of the substrate structure 2, 2', 2".

Figure 3:
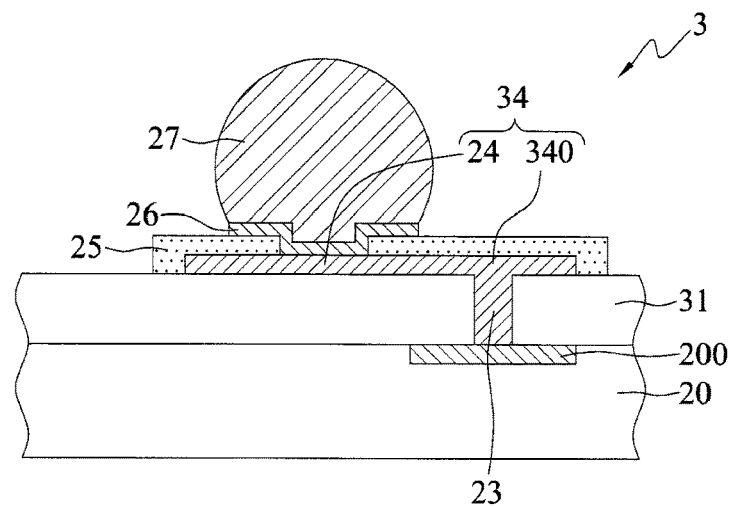
FIG. 3 is a cross-sectional view of a substrate structure according to a second embodiment of the present disclosure.
Figure 3:
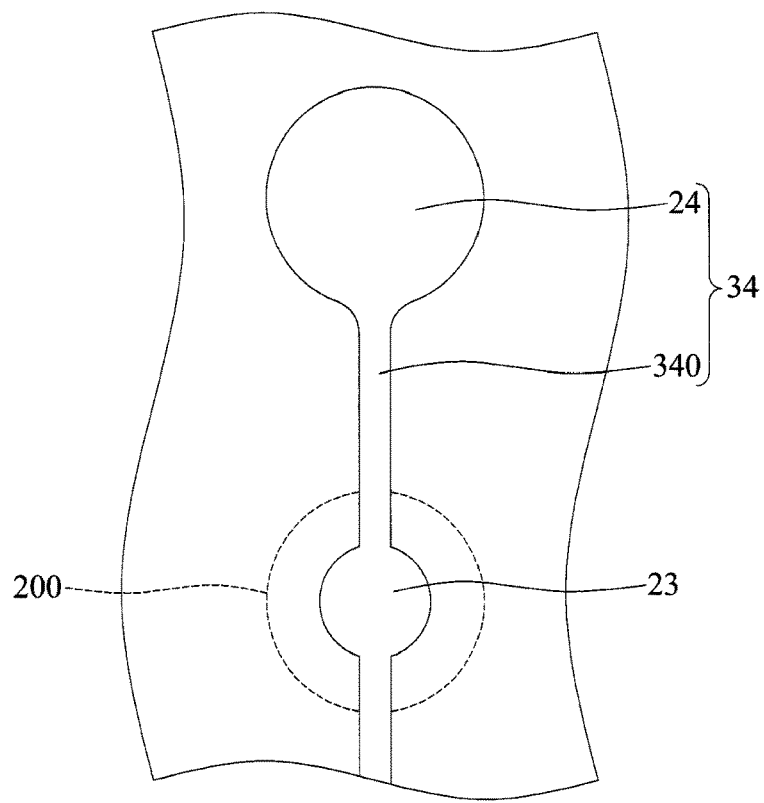

FIGS. 3 and 3' are schematic views of a substrate structure 3 according to a second embodiment of the present disclosure. The second embodiment differs from the first embodiment in an insulation layer 31 and a newly added conductive circuit 340.

Refer to FIGS. 3 and 3'. In addition to a substrate body 20, an insulation layer 31, a conductive pillar 23, a metal pad 24, an insulation protective layer 25, a metal layer 26, and other components, the substrate structure 3 further includes a conductive circuit 340 formed on the insulation layer 31 and being in contact with the metal pad 24 and the conductive pillar 23.

In an embodiment, the conductive circuit 340 and the metal pad 24 form a circuit layer 34. For example, the circuit layer 24 is formed by a process of RDL.

The substrate structure 3 according to the present embodiment is to form the conductive pillar 23, the conductive circuit 340, and the metal pad 24 between the conductive component 27 and the conductive pad 200 to disperse the remaining stress generated due to heat during the time that the conductive component 27 is welded to a semiconductor chip or a package substrate after being reflowed. Therefore, compared to the prior art, the substrate structure 3 can avoid the conductive component 27 from being cracked, so as to improve the reliability and yield of the substrate structure 3.

Figure 4:
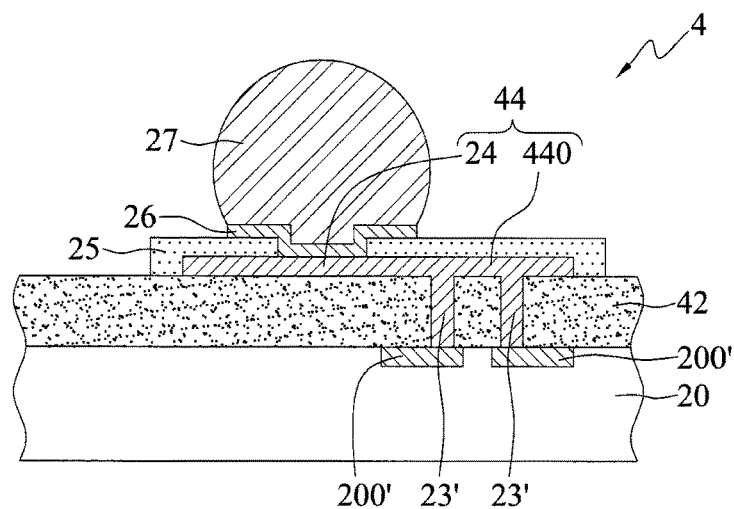
FIG. 4 is a cross-sectional view of a substrate structure according to a third embodiment of the present disclosure.
Figure 4:
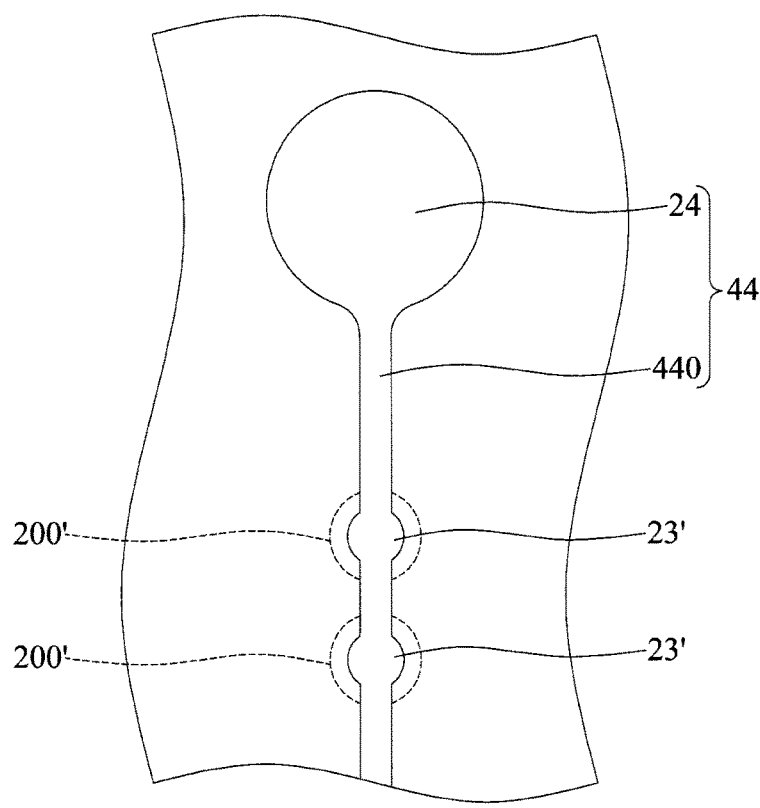

FIGS. 4 and 4' are schematic views of a substrate structure 4 according to a third embodiment of the present disclosure. The third embodiment differs from the first embodiment as shown in FIG. 2' in an insulation layer 42 and a newly added conductive circuit 440.

Refer to FIGS. 4 and 4'. In addition to a substrate body 20, an insulation layer 42, a plurality of conductive pillars 23', a metal pad 24, an insulation protective layer 25, a metal layer 26, and other components, the substrate structure 4 further includes a conductive circuit 440 formed on the insulation layer 42 and being in contact with the metal pad 24 and the conductive pillars 23'.

In an embodiment, the conductive circuit 440 and the metal pad 24 form a circuit layer 44. For example, the circuit layer 44 is formed by a process of the RDL.

The substrate structure 4 according to the present embodiment is to form the plurality of conductive pillars 23', the conductive circuit 340, and the metal pad 24 between the conductive component 27 and the conductive pad 200' to disperse the remaining stress generated due to heat during the time that the conductive component 27 is welded to a semiconductor chip or a package substrate after being reflowed. Therefore, compared to the prior art, the substrate structure 4 can avoid the conductive component 27 from being cracked, so as to improve the reliability and yield the substrate structure 4.

Figure 5:
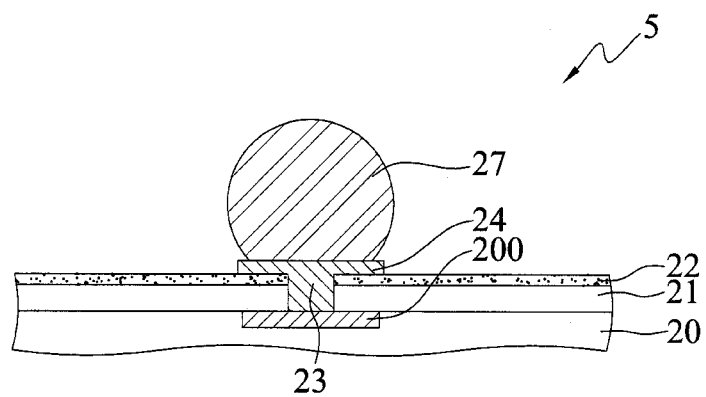
FIG. 5 is a schematic cross-sectional view showing another embodiment of FIG. 2.

On the other hand, in other embodiments the substrate structure 5 as shown in FIG. 5 may have the insulation protective layer 25 and the metal layer 26 omitted, such that the conductive component 27 can be in direct contact with the metal pad 24.

In summary, the substrate structure according to the present disclosure utilizes the design of a metal pad and a conductive pillar to reduce the occurrence of cracking due to thermal stress, thereby enhancing the reliability and yield of the substrate structure.

The present disclosure has been described using exemplary preferred embodiments. However, it is to be understood that the scope of the present disclosure is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A substrate structure, comprising:
   a substrate body having at least a conductive pad;
   at least an insulation layer formed on and directly contacting the substrate body and having at least an open hole correspondingly exposing the conductive pads;
   at least a conductive pillar disposed in the open hole and directly contacting the conductive pad;
   at least a metal pad disposed on and directly contacting each of the at least a conductive pillar;
   an insulation protective layer formed on and directly contacting the insulation layer and the at least a metal pad, wherein the insulation protective layer has at least an opening for exposing the at least a metal pad;
   a metal layer formed in the at least an opening and directly contacting the at least a metal pad; and
   at least a conductive component disposed on and directly contacting the metal layer.

2. The substrate structure of claim 1, wherein the substrate body has a plurality of the conductive pads, and the insulation layer has a plurality of the open holes, and wherein each of the conductive pillars is disposed in each of the open holes.

3. The substrate structure of claim 2, wherein the plurality of the conductive pads are coupled to the metal pads through the plurality of the conductive pillars, respectively.

4. The substrate structure of claim 2, wherein each of the conductive pads is coupled with a plurality of the conductive pillars thereon.

5. The substrate structure of claim 1, further comprising a conductive circuit formed on the insulation layer and being in contact with the at least a metal pad and the at least a conductive pillar.

6. The substrate structure of claim 5, wherein the at least a conductive circuit and the at least a metal pad form a circuit layer.

7. The substrate structure of claim 1, wherein the conductive component is formed on the metal layer that is electrically connected to the metal pad and the conductive pillar.

* * * * *